(12) United States Patent
Lascari

(10) Patent No.: US 8,421,551 B2
(45) Date of Patent: *Apr. 16, 2013

(54) MULTILAYER MICROSTRIPLINE TRANSMISSION LINE TRANSITION

(75) Inventor: Lance Dion Lascari, Rochester, NY (US)

(73) Assignee: Robert Bosch GmbH, Stuttgart (DE)

( * ) Notice: Subject to any disclaimer, the term of this patent is extended or adjusted under 35 U.S.C. 154(b) by 96 days.

This patent is subject to a terminal disclaimer.

(21) Appl. No.: 12/913,741

(22) Filed: Oct. 27, 2010

(65) Prior Publication Data

US 2011/0037532 A1    Feb. 17, 2011

Related U.S. Application Data

(63) Continuation of application No. 12/180,815, filed on Jul. 28, 2008, now Pat. No. 7,847,654.

(51) Int. Cl.
*H03H 7/38*    (2006.01)

(52) U.S. Cl.
USPC ............................................ 333/33; 174/250

(58) Field of Classification Search .................... 333/33, 333/238, 246, 260; 174/250
See application file for complete search history.

(56) References Cited

U.S. PATENT DOCUMENTS

| 5,262,783 | A | 11/1993 | Philpott et al. |
| 6,949,992 | B2 | 9/2005 | Sweeney et al. |
| 7,671,696 | B1 * | 3/2010 | Puzella et al. ................... 333/33 |
| 7,674,989 | B2 * | 3/2010 | Kikuchi et al. ............... 174/262 |
| 7,847,654 | B2 * | 12/2010 | Lascari ........................... 333/33 |
| 2002/0118083 | A1 | 8/2002 | Peergande |
| 2005/0040911 | A1 | 2/2005 | Lenz et al. |
| 2006/0255875 | A1 | 11/2006 | Iio |
| 2006/0267713 | A1 | 11/2006 | Sweeney et al. |
| 2007/0018752 | A1 * | 1/2007 | Miller .............................. 333/33 |

* cited by examiner

*Primary Examiner* — Stephen Jones
(74) *Attorney, Agent, or Firm* — Taft Stettinius & Hollister LLP; Keith Swedo

(57) ABSTRACT

A microstripline transmission line arrangement carries a signal having a fundamental frequency. The arrangement includes a first microstripline transmission line, a second microstripline transmission line, and a coaxial electrically conductive conduit interconnecting the first transmission line and the second transmission line. The conduit includes a signal conductor and an electrically grounded shield substantially surrounding the signal conductor. The conductor and the shield are positioned relative to each other to thereby comprise a means for lowpass filtering the signal. A cutoff frequency of the lowpass filtering is less than a third harmonic of the fundamental frequency.

16 Claims, 14 Drawing Sheets

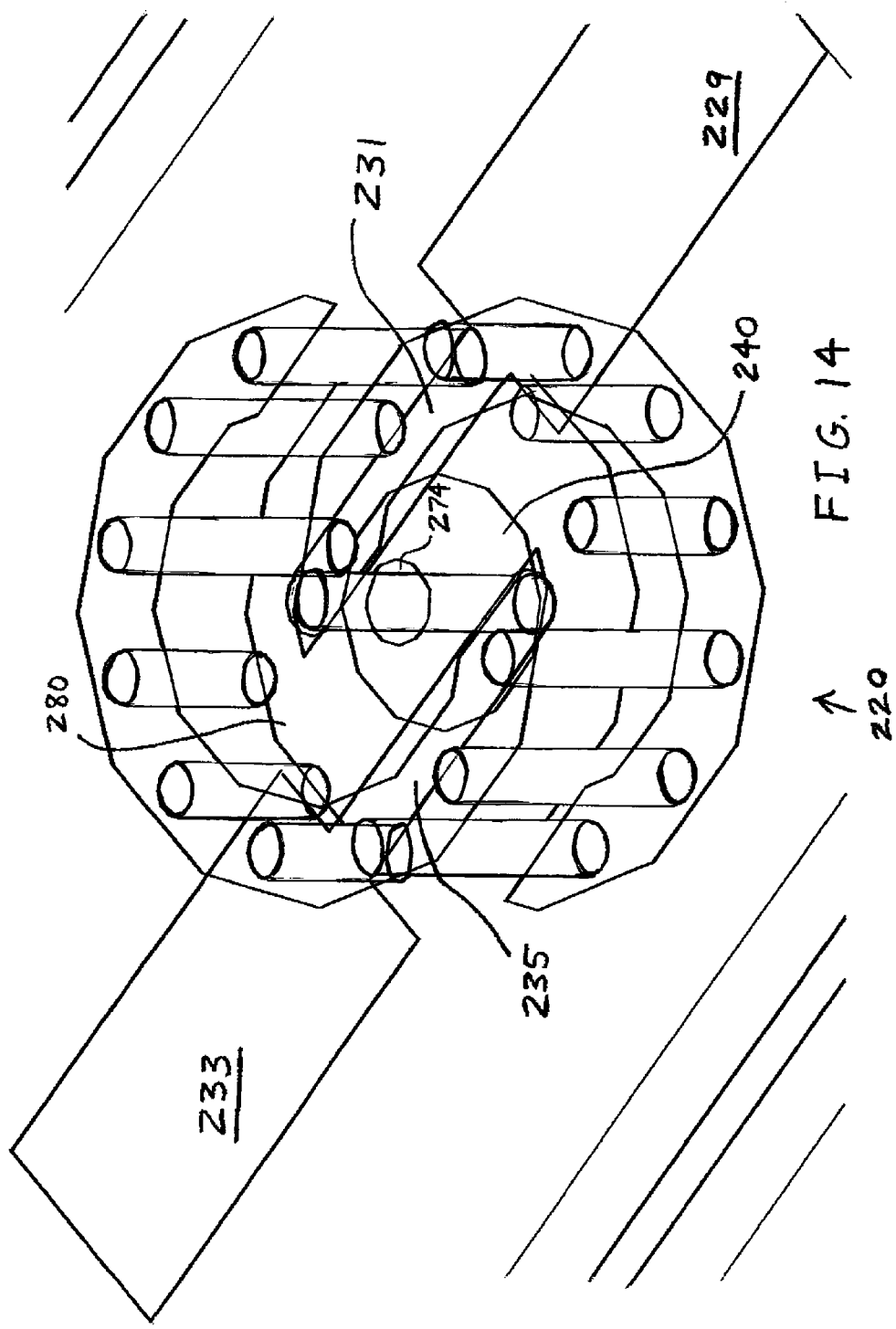

ized by the U.S. federal
MULTILAYER MICROSTRIPLINE TRANSMISSION LINE TRANSITION

CROSS-REFERENCE TO RELATED APPLICATIONS/INCORPORATION BY REFERENCE

This application is a continuation of U.S. patent application Ser. No. 12/180,815 entitled "MULTILAYER MICROSTRIPLINE TRANSMISSION LINE TRANSITION", filed Jul. 28, 2008, the complete subject matter of which is hereby incorporated herein by reference, in its entirety.

BACKGROUND OF THE INVENTION

1. Field of the Invention

The present invention relates to an apparatus for transferring high frequency signals, and, more particularly, to an apparatus for transferring high frequency signals with reduced losses at desired frequencies and/or with attenuation at undesired frequencies.

2. Description of the Related Art

In the design of low cost microwave electronics, it can be very difficult to properly shield the electronics and to limit undesired electromagnetic emissions at harmonic frequencies of the fundamental transmission. The undesired electromagnetic emissions are tightly regulated by the U.S. federal government and by the European Union, and thus there may be a need to reduce the magnitude of such emissions. Doppler transceivers for motion sensors are one example of low cost microwave electronics that may need shielding and reducing of emissions.

Typically, exotic materials and techniques are used to contain the unwanted emissions within the enclosure or housing of the electronics. For example, it is known at Robert Bosch Corporation to provide the active electronic circuit on one side of a circuit board and to provide antenna arrays, to which the active electronics are communicatively coupled, on the other side of the same circuit board. However, difficulty is presented in transmitting the desired signal from one side of the circuit board to the other (e.g., from the circuit side to the antenna side) without significant signal loss in the desired frequency range.

U.S. Pat. No. 5,262,783 to Philpot, et al., depends on resonance for efficient power transfer in the desired frequency band of operation. A problem with this approach is that the use of resonance results in a relatively narrow passband.

In many known microwave and radio frequency transceiver devices it is necessary to transfer signals from one side of a multilayer circuit board to another side, and it would be desirable to make the transfer with a minimum loss in power. Traditionally, the transfer is accomplished by use of a microstrip to coaxial to microstrip transmission line transition. In order to maintain a 50 ohm impedance in such a transition, the diameter of metal clearance in the ground plane is typically required to be fairly large. This dimension is large enough is some cases to allow direct radiation from one region to another. In low cost high frequency devices, it can be very difficult to prevent the direct radiation of undesired harmonic emissions through this large aperture.

In known transitions, the approach has been to push the cutoff frequency as high as possible by making the structure, spacing, and dimensions constant from top to bottom, i.e., throughout the transition, to simulate the constant cross section of a coaxial cable.

Accordingly, what is neither anticipated nor obvious in view of the prior art is any apparatus that is as capable as the microstripline transmission line arrangement of the present invention at transferring high frequency signals with reduced losses at desired frequencies and with attenuation at undesired frequencies. Particularly, what is neither anticipated nor obvious in view of the prior art is a microstripline transmission line arrangement in which the spacing between the signal conductor and the grounded shield varies along the length of the signal conductor.

SUMMARY OF THE INVENTION

The present invention is directed to a multilayer structure that may transfer high frequency signals from one circuit board (outer) layer to another (outer) circuit board layer. The outer layer traces may be microstripline transmission lines. A coaxial structure through the board may provide a "transition" of the high frequency signals from one circuit board layer to the other circuit board layer. The invention may provide a much smaller aperture in the coaxial section than conventional transitions. The smaller aperture may provide a lower waveguide cutoff frequency which reduces direct radiation from one side of the board to the other. The invention may incorporate a lowpass/bandstop filter.

The invention may include a multilayer structure that efficiently transfers high frequency signals from one circuit board outer layer to another circuit board outer layer. The outer layer traces may be microstripline transmission lines, and the "transition" may be a coaxial structure through the board.

In one embodiment, the invention comprises a microstripline transmission line arrangement carrying a signal having a fundamental frequency. The arrangement includes a first microstripline transmission line, a second microstripline transmission line, and a coaxial electrically conductive conduit interconnecting the first transmission line and the second transmission line. The conduit includes a signal conductor and an electrically grounded shield substantially surrounding the signal conductor. The conductor and the shield are positioned relative to each other to thereby comprise a means for lowpass filtering the signal. A cutoff frequency of the lowpass filtering is less than a third harmonic of the fundamental frequency.

The invention comprises, in another form thereof, a microstripline transmission line arrangement including a first microstripline transmission line, a second microstripline transmission line, and a coaxial electrically conductive conduit extending in a longitudinal direction to electrically couple the first transmission line and the second transmission line. The conduit includes a signal conductor and an electrically grounded element. The conductor and the grounded element are separated by a gap defined in latitudinal directions substantially perpendicular to the longitudinal direction. The gap varies in the longitudinal direction.

The invention comprises, in yet another form thereof, a microstripline transmission line arrangement including a first microstripline transmission line, a second microstripline transmission line, and a coaxial electrically conductive conduit defining a longitudinal axis and electrically coupling the first transmission line and the second transmission line. The conduit includes a signal conductor and an electrically grounded element. A first distance between the longitudinal axis and an outer edge of the conductor and/or a second distance between the longitudinal axis and the grounded element vary in a longitudinal direction.

An advantage of the present invention is that the arrangement does not depend on resonance for efficient power transfer in the desired frequency band of operation.

Another advantage is that attenuation at the harmonic, i.e., undesired frequencies is provided.

Yet another advantage is that a much smaller aperture is provided in the coaxial section than with conventional transitions, and thus a lower waveguide cutoff frequency is provided, which in turn reduces direct radiation from one side of the board to the other.

A further advantage is that the microstripline transmission line arrangement may occupy no more physical space than a traditional transition that does not have any filtering properties.

A still further advantage is that the microstripline transmission line arrangement may be manufactured of standard materials and by processes used in high volume circuit board manufacturing.

Another advantage is that the amount of harmonic energy that is radiated is reduced by both filtering it and providing more attenuation in direct radiation because of the reduced aperture size.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein:

FIG. 14 is another enlarged perspective view of the microstripline transmission line arrangement of FIG. 10.

Figure 1:
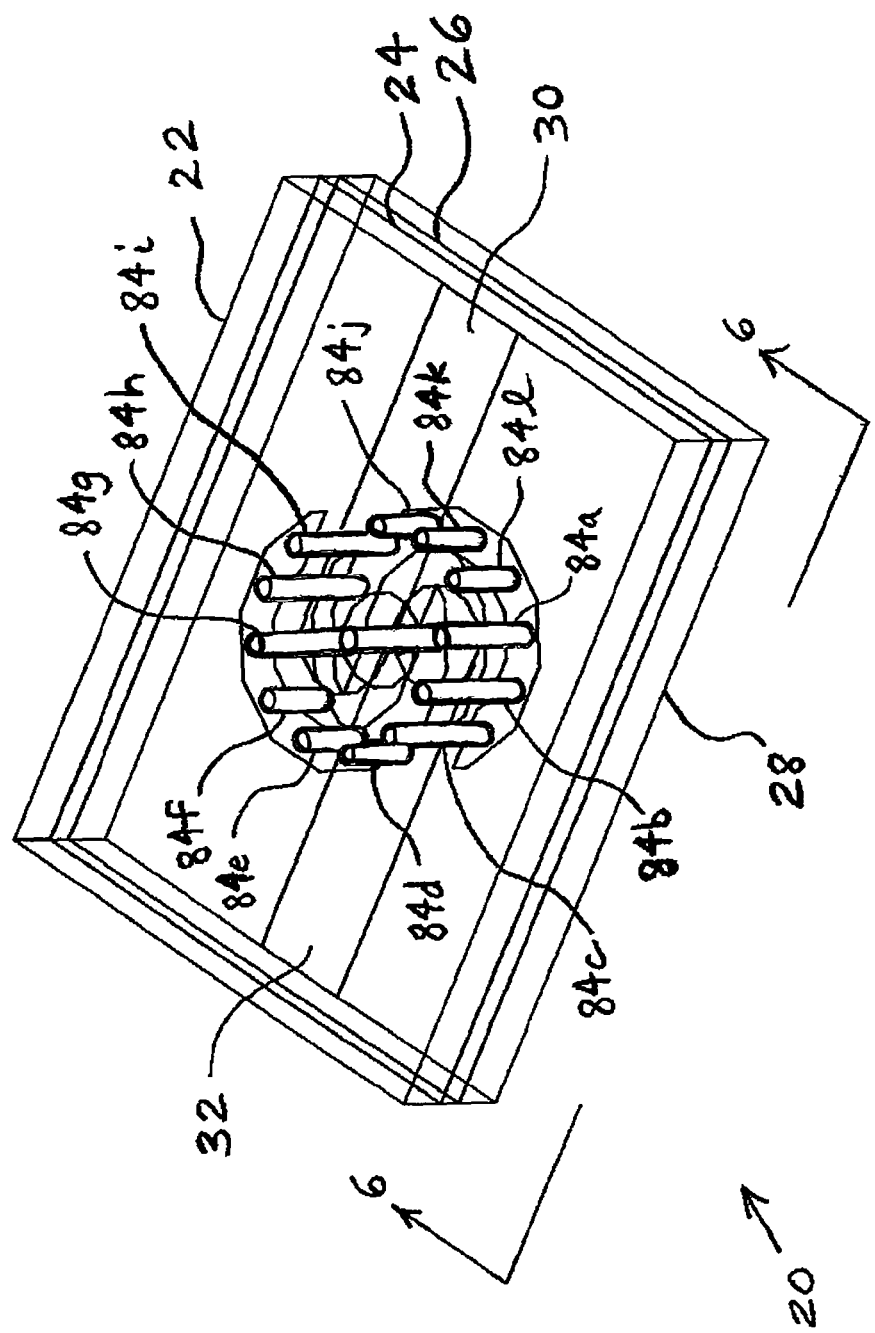
FIG. 1 is a perspective view of one embodiment of a microstripline transmission line arrangement of the present invention.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF THE PRESENT INVENTION

Referring now to the drawings and particularly to FIG. 1, there is shown one embodiment of a microstripline transmission line arrangement 20 in the form of a four layer circuit board for carrying a signal having a fundamental frequency. Arrangement 20 may have four parallel layers, including a first or top layer 22, a second layer 24 disposed just below and parallel to top layer 22, a third layer 26 disposed just below and parallel to second layer 24 such that second layer 24 is disposed between first layer 22 and third layer 26, and a fourth layer 28 disposed just below and parallel to third layer 26 such that third layer 26 is disposed between second layer 24 and fourth layer 28.

Figure 2:
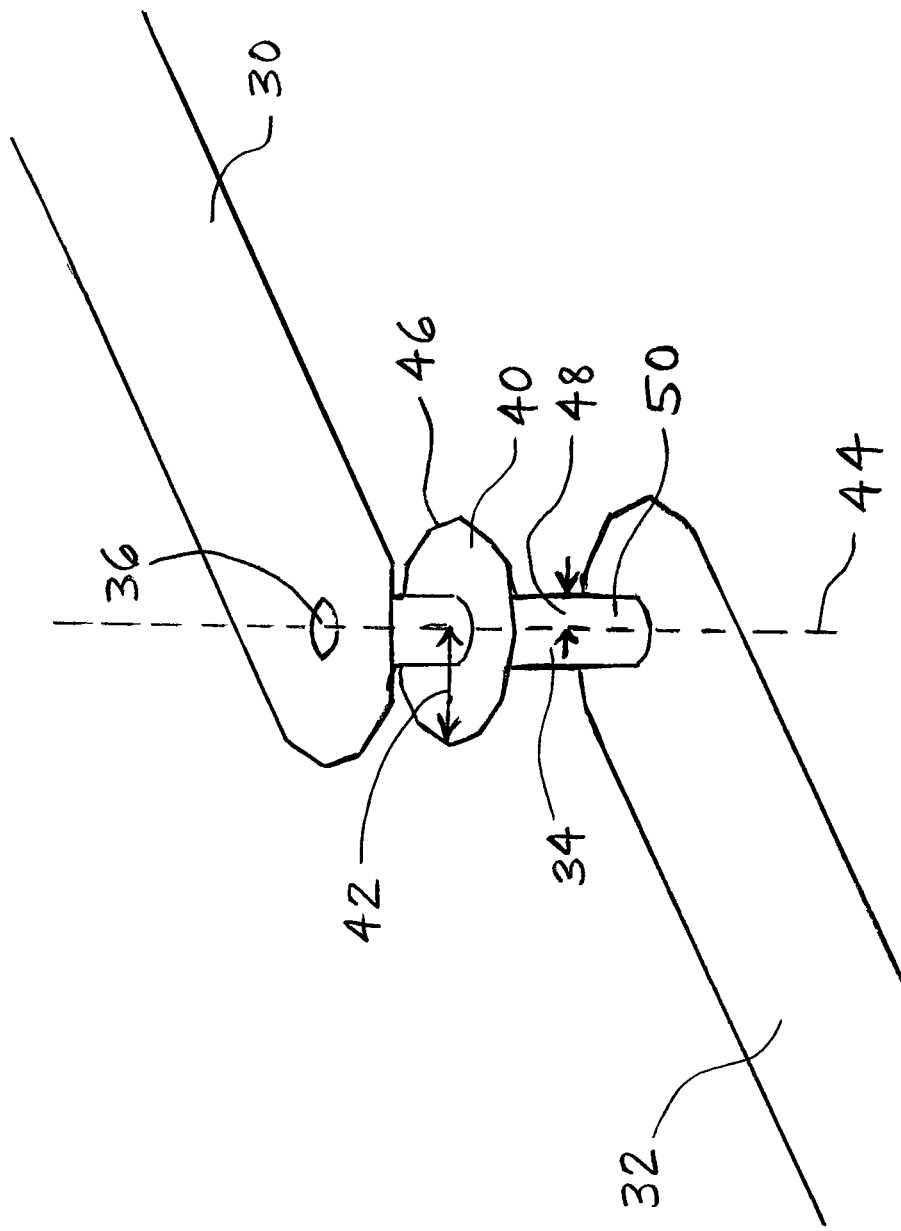
FIG. 2 is a perspective view of the signal conduit interconnecting two microstripline transmission lines according to the microstripline transmission line arrangement of FIG. 1.

Arrangement 20 includes an electrically conductive path provided by a first microstrip transmission line 30 in first layer 22, a second microstrip transmission line 32 in fourth layer 28, and a signal conductor 34 (FIG. 2) having a top end 36 attached to line 30 and a bottom end 38 attached to line 32. In the embodiment of FIG. 2, signal conductor 34 has a circular cross section throughout its height between lines 30 and 32. The cross section of conductor 34 is constant throughout its height with the exception that conductor 34 has a pad in the form of a disk 40 with a larger diameter than the other portions of conductor 34 above and below disk 40. Thus, conductor 34 has a constant circular cross section along its height between disk 40 and line 30, and conductor 34 has the same constant circular cross section along its height between line 32 and disk 40. Disk 40 has a radius 42 between a central axis 44 of conductor 34 and an outer edge 46 of disk 40, and the remainder of conductor has a radius 48 between axis 44 and outer surface 50. In one embodiment, radius 42 of disk 40 is more than three times as greater as radius 48. The height, i.e., thickness, of disk 40 may be less than one percent of the distance along axis 44 between lines 30 and 32. Disk 40 may be oriented parallel to lines 30 and 32, and disk 40 may be co-planar with second layer 24.

Figure 3:
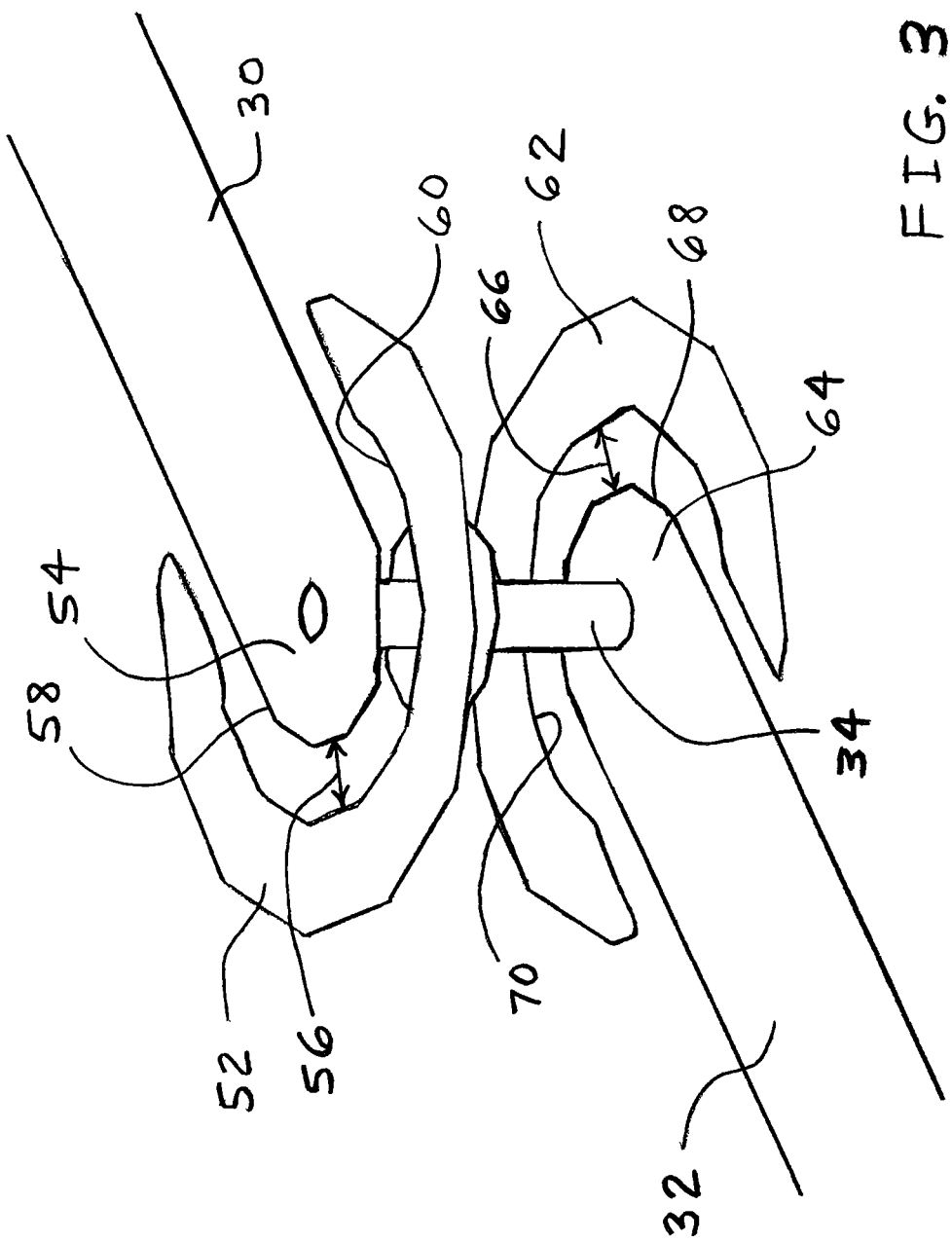
FIG. 3 is a perspective view of the two ground traces added to the signal conduit and two microstripline transmission lines of FIG. 2.

A first C-shaped ground trace 52 (FIG. 3) is provided adjacent to an end 54 of first transmission line 30. Ground trace 52 may be co-planar with first layer 22 and with first transmission line 30. A substantially constant gap 56 may separate an outer edge 58 of first transmission line 30 and an inner edge 60 of ground trace 52. A second C-shaped ground trace 62 is provided adjacent to an end 64 of second transmission line 32. Ground trace 62 may be co-planar with fourth layer 28 and with second transmission line 32. A substantially constant gap 66 may separate an outer edge 68 of second transmission line 32 and an inner edge 70 of ground trace 62. Gaps 56 and 66 may be defined in latitudinal directions that are perpendicular to a longitudinal direction defined by axis 44. Trace 52 may be of the same size, shape and dimensions as trace 62. Further, first transmission line 30 may be of the same size, shape and dimensions as second transmission line 32. Further still, gaps 56 and 66 may likewise be of the same size, shape and dimensions. Gaps 56 and 66 may be continuous such that ground trace 52 is not electrically connected to first transmission line 30, and ground trace 62 is not electrically connected to second transmission line 32.

Figure 4:
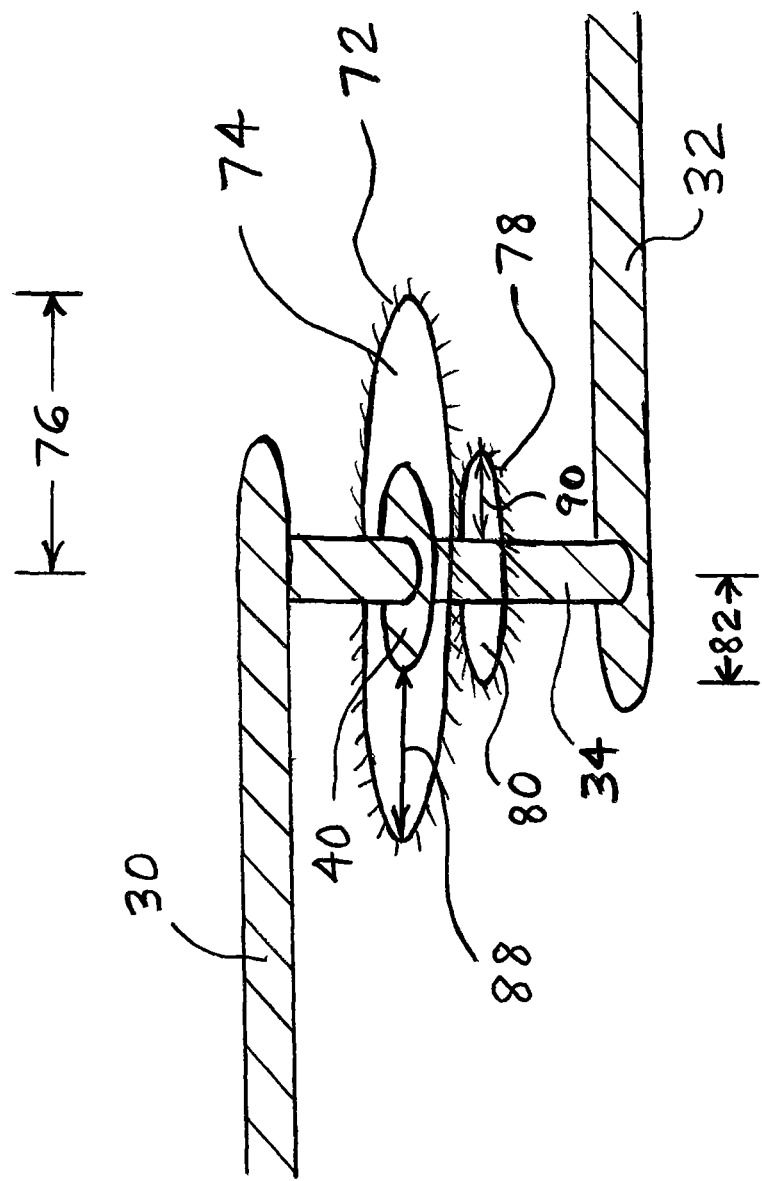
FIG. 4 is a perspective view of the two ground plane openings receiving the signal conduit interconnecting two microstripline transmission lines of FIG. 2.

Illustrated in FIG. 4 is a first ground plane 72 that is co-planar with second layer 24. Ground plane 72 may be in the form of a thin sheet of electrically conductive material, such as copper, having a circular void 74 in which is received disk 40 of signal conductor 34. In one embodiment, a radius 76 or diameter of void 74 is approximately between two and three times as large as radius 42 or diameter of disk 40.

Also illustrated in FIG. 4 is a second ground plane 78 that is co-planar with third layer 26. Ground plane 78, like ground plane 72, may be in the form of a thin sheet of electrically conductive material, such as copper. Ground plane 78 may have a circular void 80 in which is received signal conductor 34. In one embodiment, a radius 82 or diameter of void 80 is less than radius 42 or diameter of disk 40.

Figure 5:
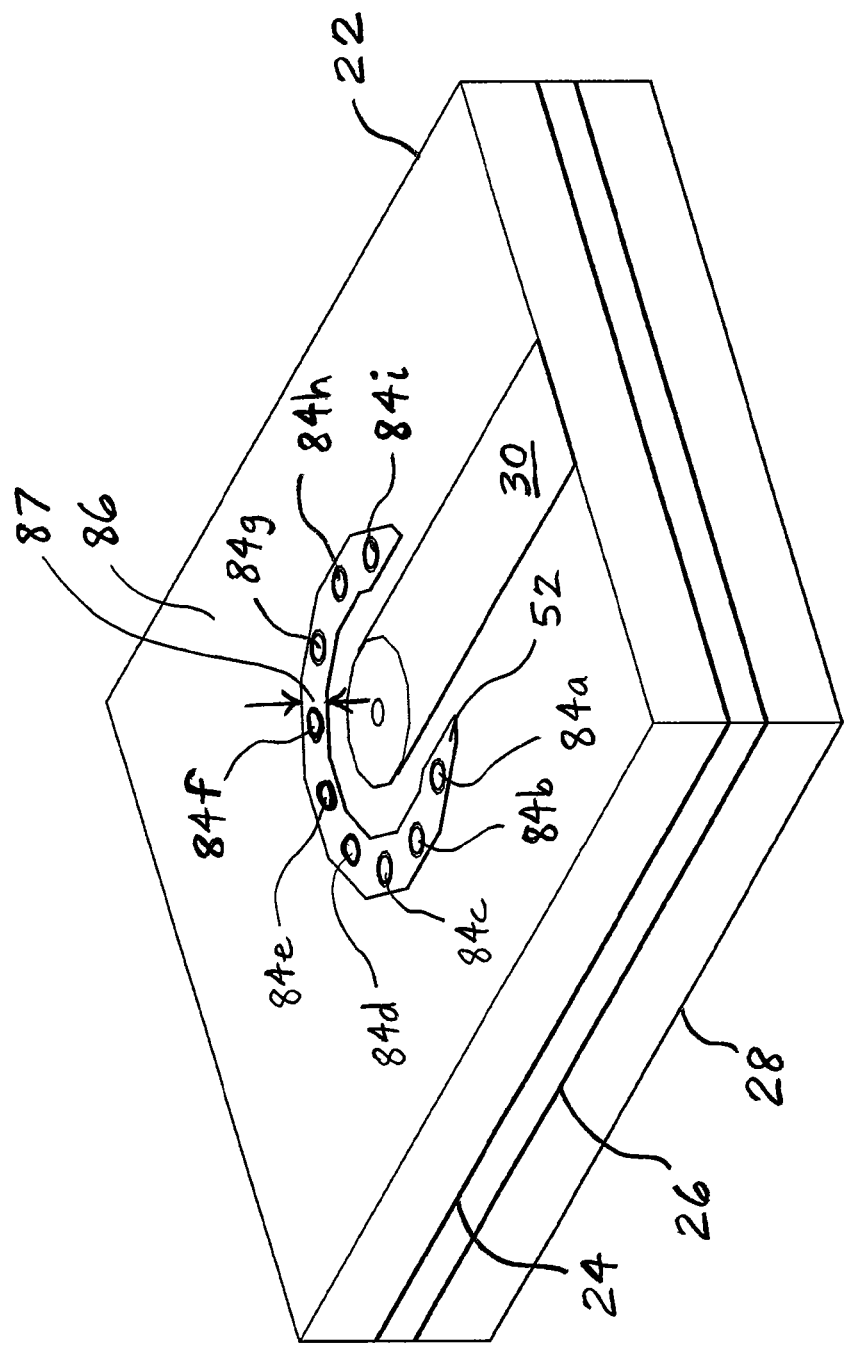
FIG. 5 is a perspective view of the microstripline transmission line arrangement of FIG. 1 filled with dielectric material.

As best shown in FIG. 5, connected to first ground trace 52 are nine electrically conductive ground vias 84*a-i* that are cylindrically-shaped and that are oriented in vertical directions perpendicular to layers 22, 24, 26 and 28. FIG. 5 is a view in which dielectric material 86 is provided to fill gap 56, to cover ground plane 72, i.e., to fill gaps between first transmission line 30 and first ground plane 72, to fill gaps between ground planes 72 and 78, and to fill gaps between second transmission line 32 and second ground plane 78. Each of vias 84*a-l* and signal conductor 34 may have a cross section that is 0.33 millimeter wide. In one embodiment, ground trace 52 has a width 87 of 0.58 millimeter, and each of vias 84*a-l* is centered within this width 87.

In one particular embodiment, ground planes 72 and 78 are formed of sheets of copper having a thickness of about 0.018 millimeter. Arrangement 20 may be fabricated with a "prepreg" dielectric layer. "Prepregs" are pre-impregnated materials which may be in the form of reinforcement fibers or fabrics into which a pre-catalyzed resin system has been impregnated by a machine. The prepreg dielectric layer of arrangement 20 may have a thickness of 0.38 millimeter and may be sandwiched between two sheets of 0.78 millimeter thick dielectric material having copper sheets on both sides of the dielectric sheet. Thus, the outer copper sheets of one such dielectric sheet form layers 22 and 24, and the outer copper sheets of the other dielectric sheet form layers 26 and 28. Dielectric material 86 may be in the form of a glass epoxy, such as FR4, having a dielectric constant of 4.18 and a dielectric loss tangent of 0.02.

Based on the dimensions provided above, the overall height or thickness of arrangement 20 at points having copper on both outer surfaces (such as where transmission lines 30 and 32 are vertically overlapping or aligned, or where traces 52 and 62 are vertically overlapping or aligned) may be calculated as:

2×0.78 mm (outer dielectric layers)+0.38 mm (middle prepreg dielectric layer)+4×0.018 mm (copper sheets)=2.012 millimeter.

The overall height or thickness of arrangement 20 at points having copper on only one of the two outer surfaces (such as where one of transmission lines 30 and 32 appears, but the other of transmission lines 30 and 32 is not vertically overlapping or aligned, or where one of traces 52 and 62 appears, but the other of traces 52 and 62 is not vertically overlapping or aligned) may be calculated as:

2×0.78 mm (outer dielectric layers)+0.38 mm (middle prepreg dielectric layer)+3×0.018 mm (copper sheets)=1.994 millimeter.

The overall height or thickness of arrangement 20 at points having copper on neither of the outer surfaces may be calculated as:

2×0.78 mm (outer dielectric layers)+0.38 mm (middle prepreg dielectric layer)+2×0.018 mm (copper sheets)=1.976 millimeter.

Figure 6:
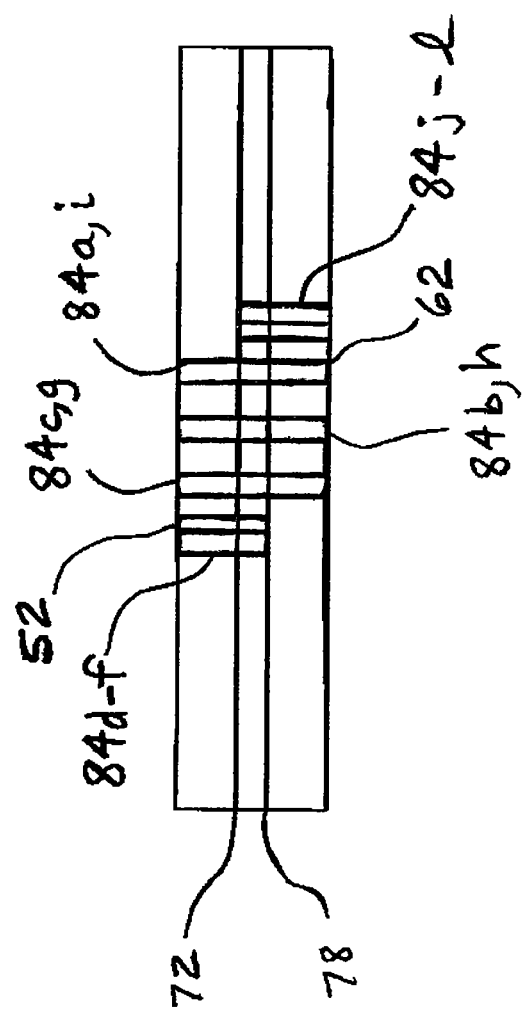
FIG. 6 is a side view of the microstripline transmission line arrangement of FIG. 1 along line 6-6.

As indicated in FIG. 6, which does not include the opaque dielectric material, vias 84*a-c* and 84*g-i* extend from first ground trace 52, through first ground plane 72, through second ground plane 78, and are electrically connected to second ground trace 62. Because vias 84*d-f* are not aligned with second ground trace 62, vias 84*d-f* would not intersect trace 62 if vias 84*d-f* were to extend below second ground plane 78, and thus, in fact, vias 84*d-f* do not extend below second ground plane 78. Rather, vias 84*d-f* extend between second ground plane 78 and first ground trace 52.

In addition to the six aforementioned ground vias 84*a-c* and 84*g-i* that are connected to second ground trace 62, ground vias 84*j-l* are connected to second ground trace 62 but are not connected to first ground trace 52. Because vias 84*j-l* are not aligned with first ground trace 52, vias 84*j-l* would not intersect trace 52 if vias 84*j-l* were to extend above first ground plane 72, and thus, in fact, vias 84*j-l* do not extend above first ground plane 72. Rather, vias 84*j-l* extend between first ground plane 72 and second ground trace 62.

Ground vias 84*a-l* may all have constant cross sections along their heights, and these cross sections may be equivalent to the cross section of signal conductor 34 (above or below disk 40). In one embodiment, vias 84*a-l* are in the form of tubes having inner diameters of 0.254 millimeter and wall thicknesses of 0.038 millimeter, thereby yielding outer diameters of 0.33 millimeter. A central axis of each of vias 84*a-l* may be spaced 1.5 millimeter away from axis 44 of signal conductor 34.

As described above, ground vias 84*a-l*, ground planes 72, 78, and ground traces 52, 62 are all electrically connected together and may be connected to electrical ground to thereby conjunctively form an electrically grounded shield surrounding signal-carrying element 34. This electrically grounded shield in conjunction with signal conductor 34 may form a coaxial electrically conductive conduit that interconnects transmission lines 30 and 32. All portions of the conductive conduit, as well as transmission lines 30 and 32, may be formed of a same electrically conductive material, such as copper.

As is evident from FIG. 4 in particular, the gap between signal conductor 34 and the electrically grounded shield varies along axis 44. For example, a gap 88 (FIG. 4) between disk 40 and first ground plane 72 may be different from a gap 90 between signal conductor 34 and second ground plane 78. Further, both gap 88 and gap 90 may be different than either of gaps 56 and 66. Further still, the latitudinal gap between signal conductor 34 and ground vias 84*a-l* at vertical levels between transmission lines 30, 32 and between ground planes 72, 78 may also be different than any of gaps 56, 66, 88 and 90.

The above-described varying gaps between signal conductor 34 and the ground shield may provide capacitance and inductance in the conductive path between transmission lines 30, 32. That is, there are varying levels of capacitance between signal conductor 34 and the ground shield along the length of conductor 34. There are also varying levels of inductance connected in series with conductor 34 both before and after each capacitance along the length of conductor 34. The capacitance and inductance may provide low pass filtering of a signal that is carried by arrangement 20.

In one embodiment, the varying magnitudes of the gaps or latitudinal distances between the signal conductor and the ground shield are chosen such that a cutoff frequency of the lowpass filtering is less than a third harmonic of the fundamental frequency of the signal carried by arrangement 20. In one specific embodiment, provided herein merely as an example, a diameter of void 74 is 3 millimeters, a diameter of pad 40 is 0.4 millimeter, and a diameter of void 80 is 1.3 millimeters. This specific embodiment provides good attenuation of a 31.5 GHz third harmonic of a sensor transmission having a 10.5 GHz fundamental frequency. That is, the cutoff frequency of the lowpass filtering is less than the 31.5 GHz third harmonic of the 10.5 GHz fundamental frequency. In another embodiment, the varying magnitudes of the gaps or latitudinal distances between the signal conductor and the ground shield are chosen such that a cutoff frequency of the lowpass filtering is less than a tenth harmonic of the fundamental frequency of the signal carried by arrangement 20.

Among the considerations in selecting the varying gaps between the signal conductor and the ground shield, the smaller the gaps, the less the radiation. Also, the smaller the gaps, the greater the capacitance. Moreover, the smaller the diameter of the signal conductor, the higher the inductance. The signal loss may be reduced by balancing the various inductances and capacitances.

Figure 7:
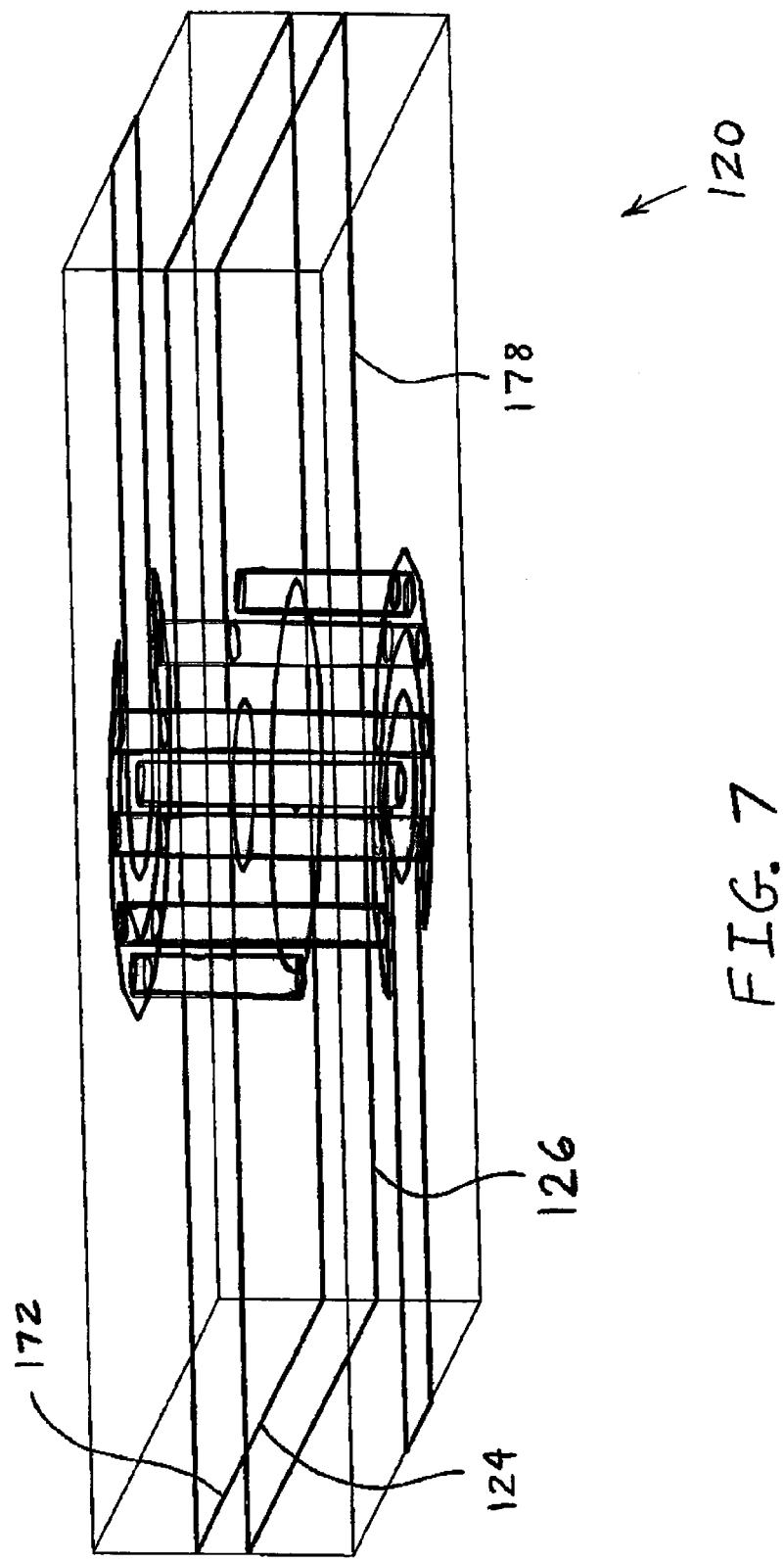
FIG. 7 is a perspective view of another embodiment of a microstripline transmission line arrangement of the present invention.
Figure 8:
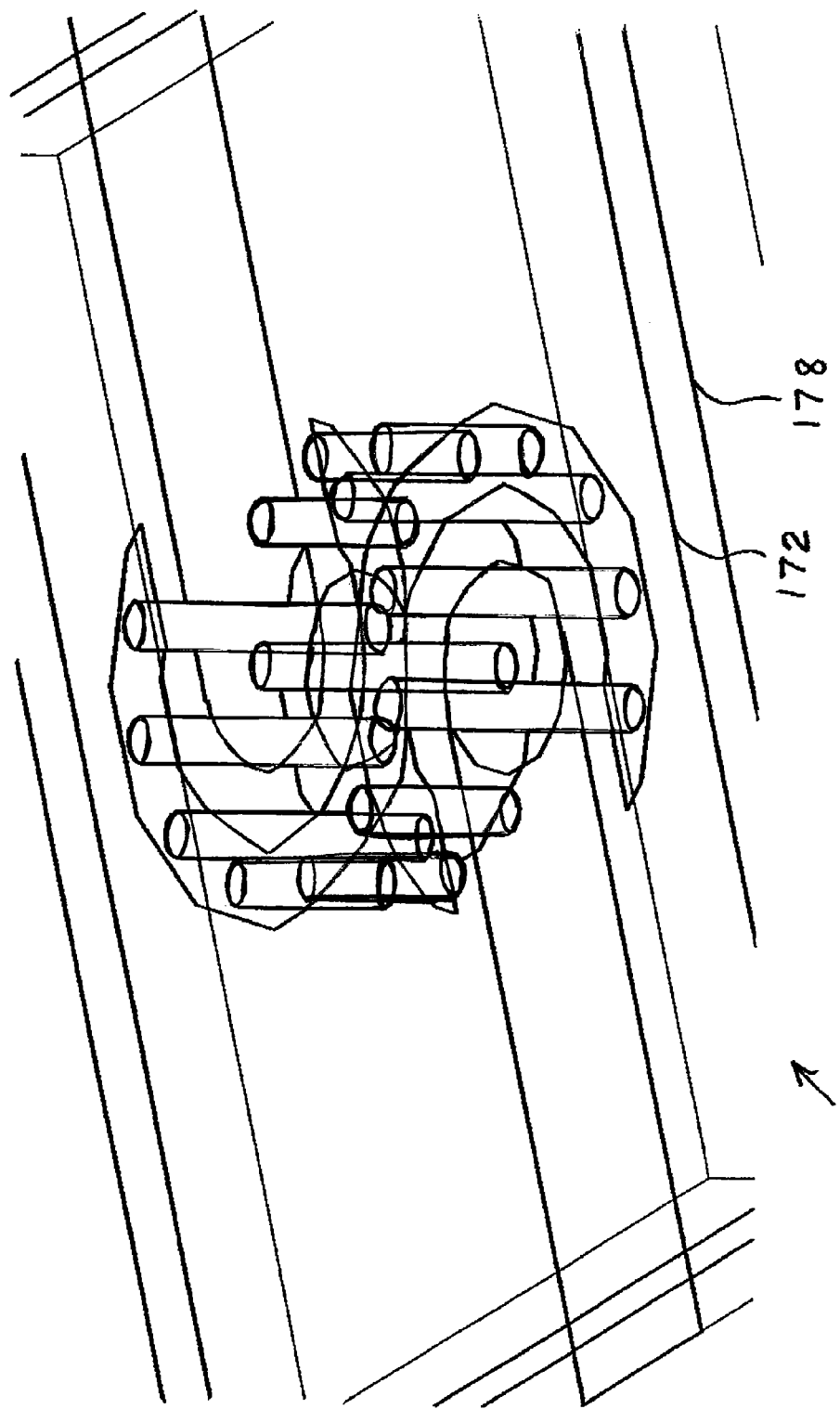
FIG. 8 is an enlarged perspective view of the microstripline transmission line arrangement of FIG. 7.
Figure 9:
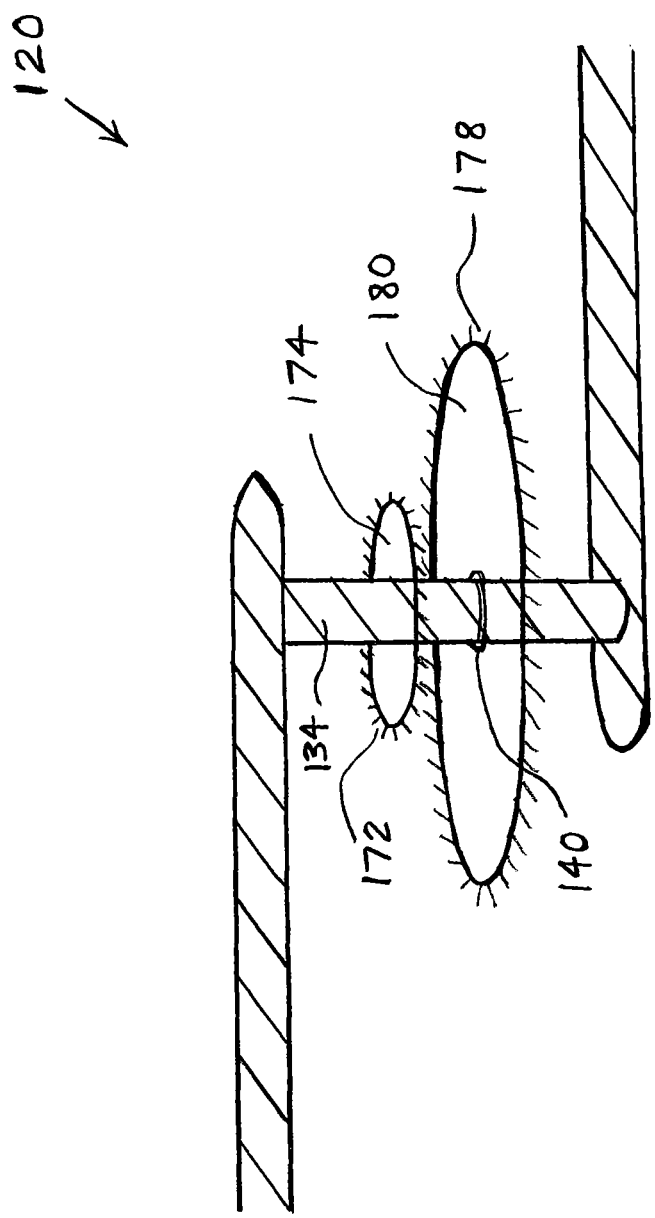
FIG. 9 is a perspective view of the two ground plane openings receiving the signal conduit interconnecting two microstripline transmission lines of the microstripline transmission line arrangement of FIG. 7.
Figure 10:
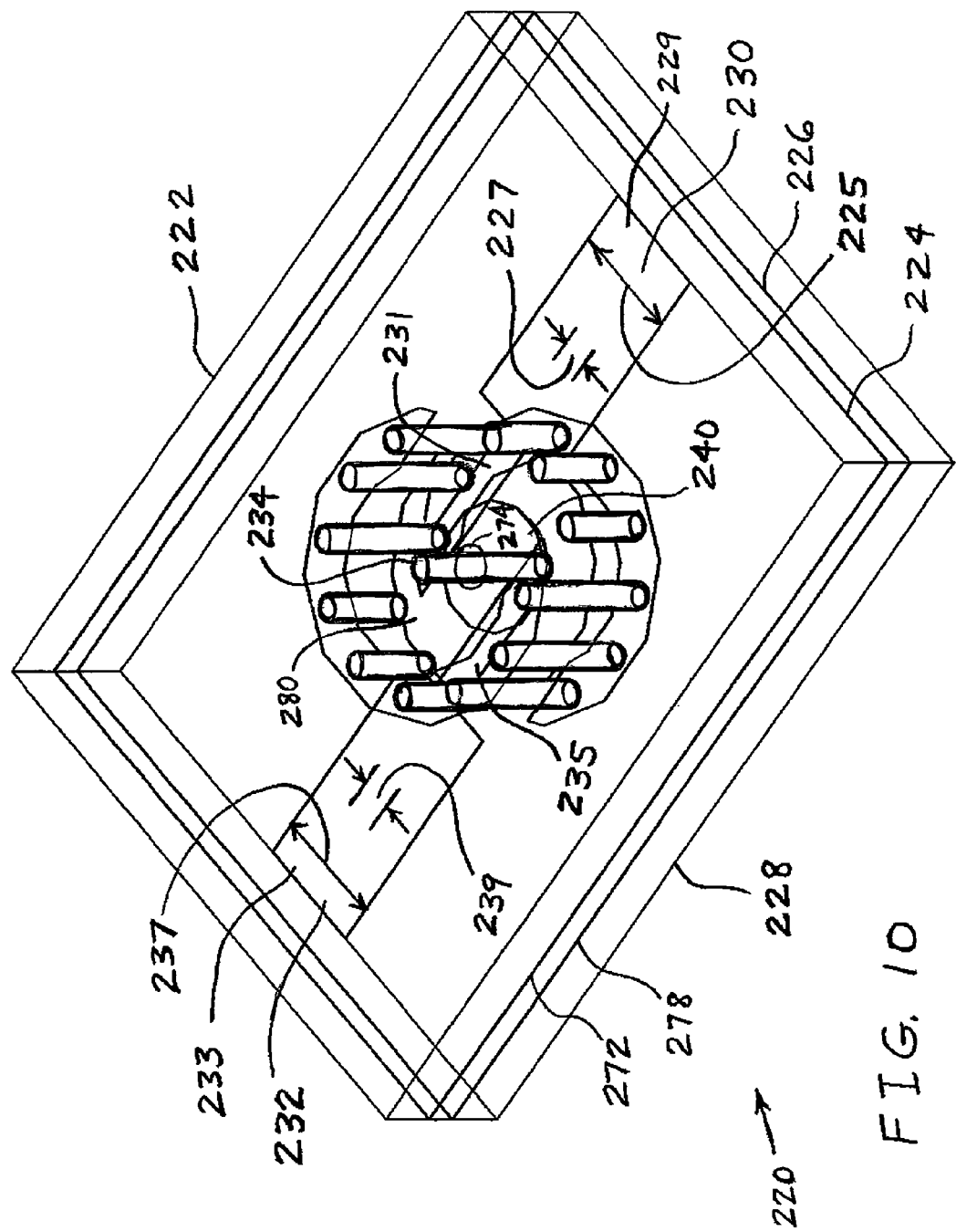
FIG. 10 is a perspective view of yet another embodiment of a microstripline transmission line arrangement of the present invention.
Figure 11:
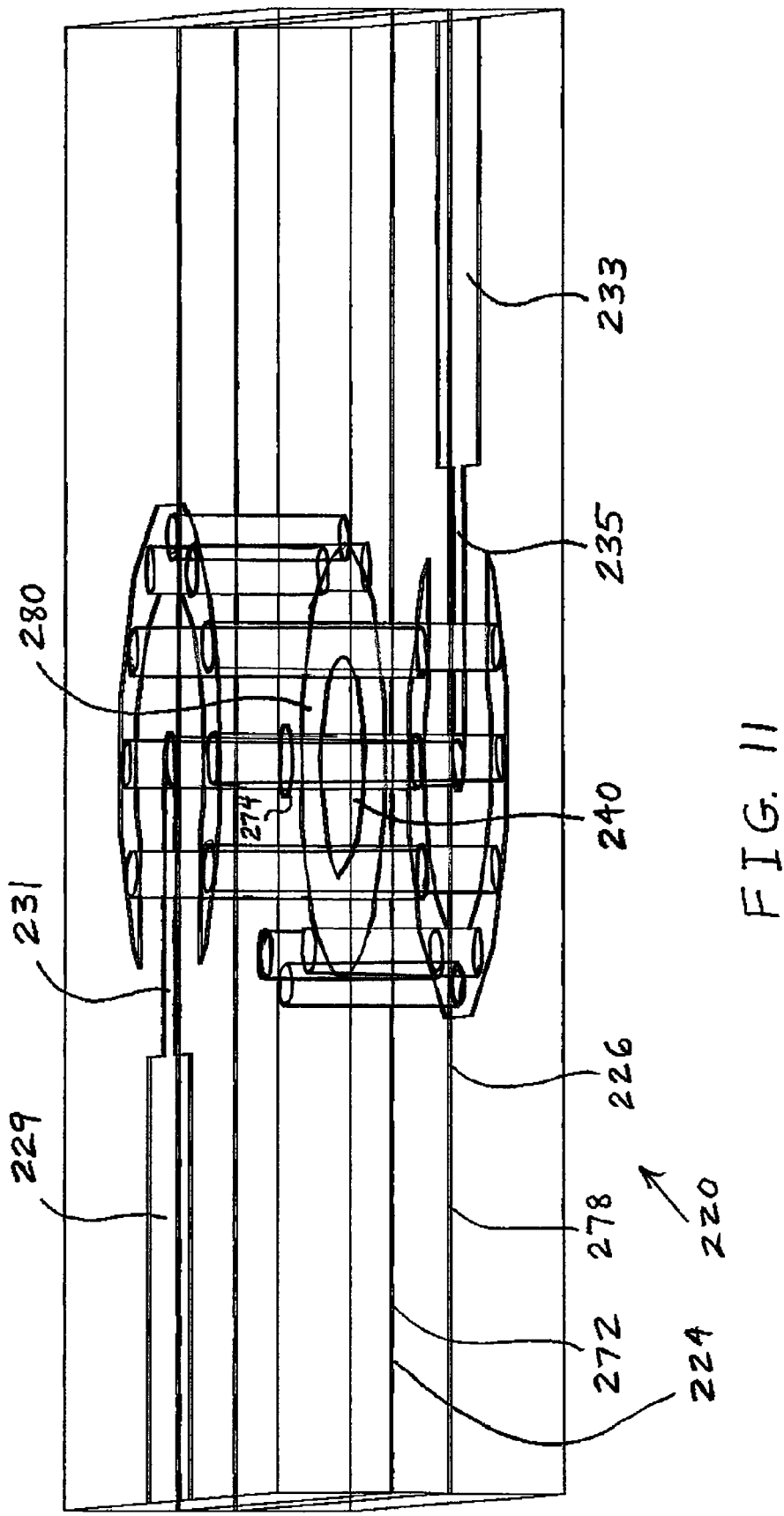
FIG. 11 is another perspective view of the microstripline transmission line arrangement of FIG. 10.
Figure 12:
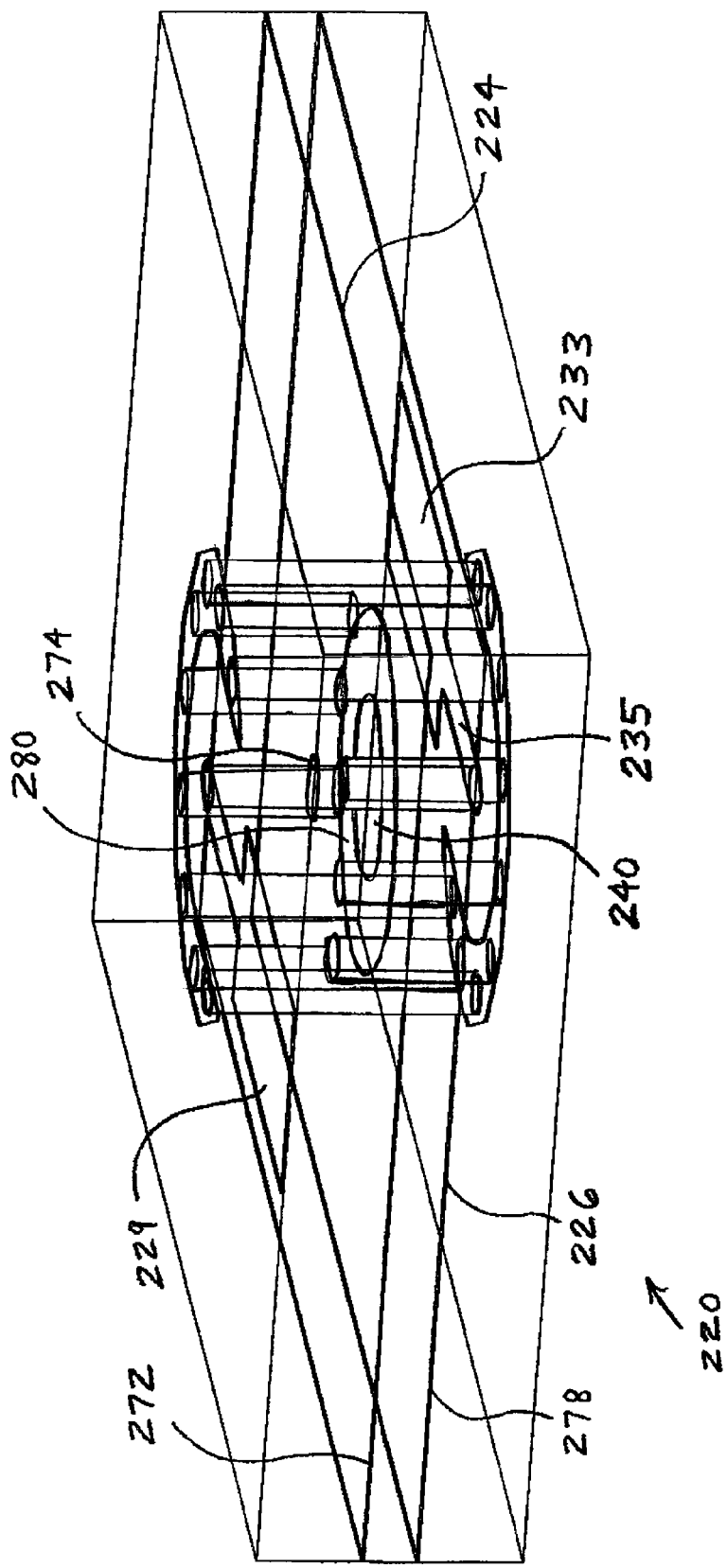
FIG. 12 is yet another perspective view of the microstripline transmission line arrangement of FIG. 10.
Figure 13:
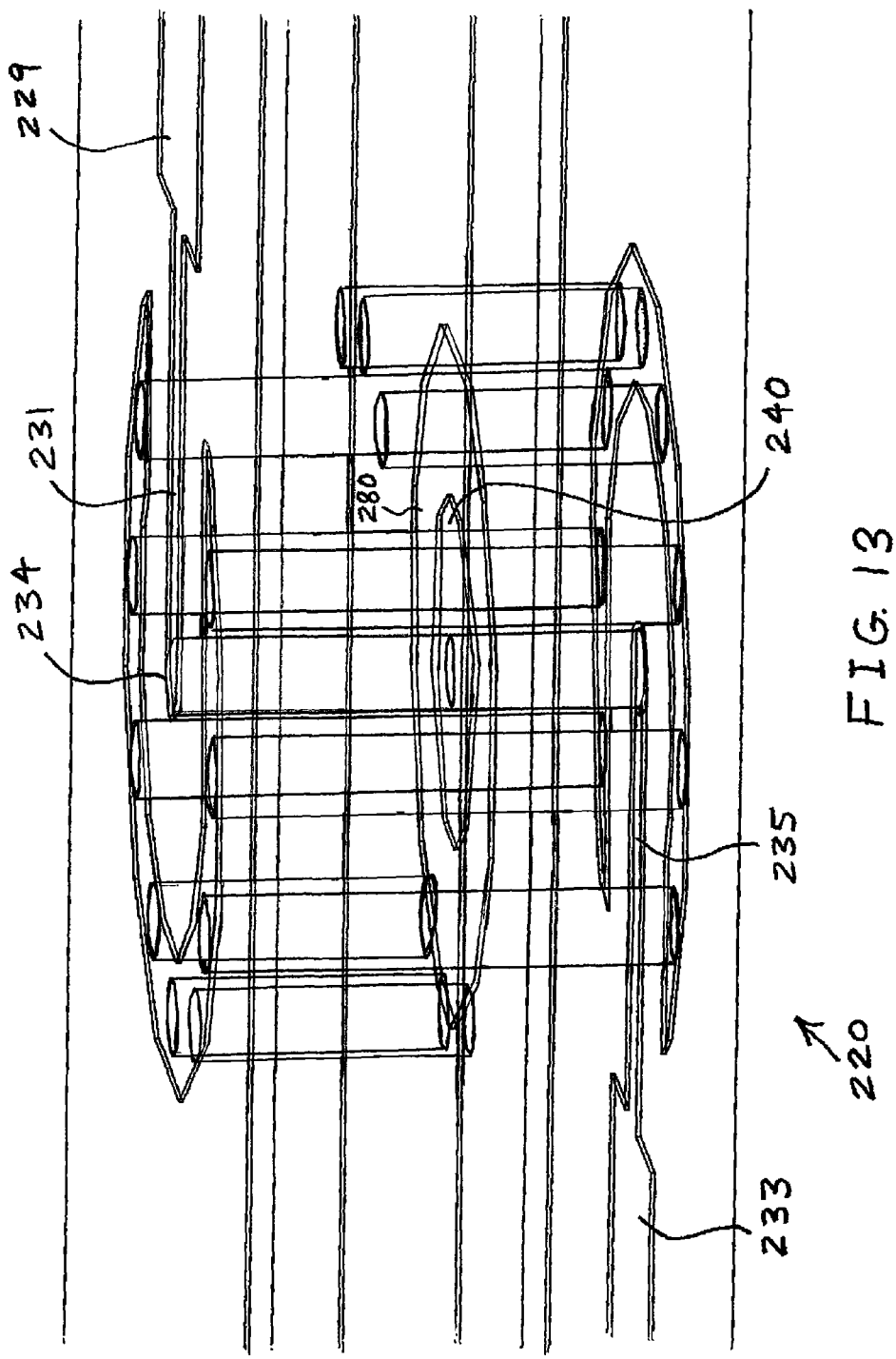
FIG. 13 is an enlarged perspective view of the microstripline transmission line arrangement of FIG. 10.

In another embodiment of a microstripline transmission line arrangement 120 illustrated in FIGS. 7-9, a circular void 174 of a first ground plane 172 of a second layer 124 has a diameter that is less than one-half of a diameter of a circular void 180 of a second ground plane 178 of a third layer 126. A signal conductor 134 has a pad/disk 140 that is co-planar with second ground plane 178, but there is no pad/disk co-planar with first ground plane 172. A diameter of pad/disk 140 may be less than one-half of a diameter of void 174. Other features of arrangement 120 are substantially the same as those of arrangement 20, are thus are not discussed herein in order to avoid needless repetition.

A third embodiment of a microstripline transmission line arrangement 220 is illustrated in FIGS. 10-14. Arrangement 220 may be particularly appropriate for use with a transmission frequency in the 5 GHz wireless band. For example, arrangement 220 may provide some harmonic frequency attenuation of second, third and fourth harmonics of a 5.6 GHz carrier.

A first layer 222 includes a first transmission line 230 having a distal section 229 and a proximal section 231 which electrically connects distal section 229 to a signal conductor 234. A width 225 of distal section 229 is over twice as great as a width 227 of proximal section 231. Similarly, a fourth layer 228 includes a second transmission line 232 having a distal section 233 and a proximal section 235 which electrically connects distal section 233 to signal conductor 234. A width 237 of distal section 233 is over twice as great as a width 239 of proximal section 235. In one embodiment, widths 225 and 237, as well as the widths of transmission lines 30 and 32, are 1.45 millimeters, yielding 50 ohm impedances.

The thinner distal sections 229, 233 of transmission lines 230, 232 may have the effect of increasing the inductance of the conductive path through arrangement 220 for lowpass filtering purposes. In another embodiment (not shown), a discrete inductor, such as a surface mounted device, electrically interconnects two portions of a transmission line in order to provide inductance within the conductive path.

A circular void 274 of a first ground plane 272 of a second layer 224 has a diameter that is less than one-fifth of a diameter of a circular void 280 of a second ground plane 278 of a third layer 226. The diameter of void 274 may be less than seventy percent greater than a diameter of signal conductor 234. In one embodiment, void 274 is provided with a diameter that is as small as possible in order to facilitate the attenuation of higher frequency radiation of harmonics. The shielding provided by first ground plane 272 may be beneficial at these frequencies because otherwise the harmonics could radiate directly between the first transmission line and the second transmission line. For example, first ground plane 272 may be effective in further attenuating fifth and higher harmonics of a 5.6 GHz carrier due to the small diameter of void 274.

Signal conductor 234 has a pad/disk 240 that is co-planar with second ground plane 278, but there is no pad/disk co-planar with first ground plane 272. A diameter of pad/disk 240 may be over four times greater than the diameter of void 274 and more than one-half of the diameter of void 280. Other features of arrangement 220 are substantially the same as those of arrangement 20, are thus are not discussed herein in order to avoid needless repetition.

Arrangement 220 may be modeled as a series inductance connected to a shunt capacitance followed by another series inductance. The first series inductance may be provided by the input transmission line with a narrow width. The shunt capacitance may be provided by the combination of the narrow ground plane void on layer two and the disk/pad on layer three. The second series inductance may be provided by the output transmission line with a narrow width.

There are several novel features of the present invention that depend upon the frequency of the signal carried by the arrangement, and such features may not be completely illustrated by the drawings. Among these features is the variability of the number and spacing of the ground vias, which may be used to control impedance.

Although a few specific combinations of signal conductor pads/disks and/or variable ground plane voids have been described herein as examples of embodiments of the arrangement of the present invention, any combination of pads/disks and varying voids may be provided on the levels of the two ground planes within the scope of the invention. A number of ground planes other than two, and annular recesses provided in the signal conductor instead of annular disk projections may also be within the scope of the invention. The invention may encompass any arrangement in which the gap between the signal conductor and the ground shield varies along the length of the signal conductor.

Components of the microstripline transmission line arrangement of the present invention have, purely for the sake of convenience, been described herein as being oriented relative to a vertical direction, or being disposed above or below other components. However, it is to be understood that, within the scope of the invention, there are no limitations placed on the orientation of the microstripline transmission line arrangement relative to vertical or horizontal directions, or relative to any other directional reference.

The signal conductor and its disk have been shown herein as having circular cross sections. The voids in the ground planes in which the signal conductor and its disk are received are also shown herein as having a circular shape. However, it is to be understood that it is within the scope of the invention for the cross sections of the signal conductor and its disk to be other than circular, such as square-shaped, for example. It is also within the scope of the invention for the shapes of the voids of the ground planes to be other than circular, such as square-shaped, for example. Any component or void described herein as being circular or having a diameter may, in actuality, have a shape that approximates a circle but is, in fact, shaped as a polygon. Particularly, the components and voids described herein as being circular or as having a diameter may be shown in some of the drawings as having the shapes of twelve-sided polygons. Polygon shapes may have the advantages of being easier to manufacture and to mathematically model than shapes that are more truly circular.

In the embodiments disclosed herein, the top transmission line, e.g., transmission line 30, may be considered the signal input and the bottom transmission line, e.g., transmission line 32, may be considered the signal output. However, it is within the scope of the invention in all of the disclosed embodiments for the bottom transmission line to be used as an input and the top transmission line to be used as an output.

While this invention has been described as having an exemplary design, the present invention may be further modified within the spirit and scope of this disclosure. This application is therefore intended to cover any variations, uses, or adaptations of the invention using its general principles.

What is claimed is:

1. A microstripline transmission line arrangement, the arrangement comprising:
a first microstripline transmission line;
a second microstripline transmission line; and
a coaxial electrically conductive conduit extending in a longitudinal direction to electrically couple the first transmission line and the second transmission line, the conduit including a signal conductor and an electrically grounded element, the conductor and the grounded element being separated by a gap defined in latitudinal directions substantially perpendicular to the longitudinal direction, the gap varying in the longitudinal direction in between the first and second transmission lines, the signal conductor including a polygon-shaped cross section, wherein the signal conductor includes a polygon-shaped pad that is oriented in the latitudinal directions, the polygon-shaped pad having a first width greater than a second width of the signal conductor.

2. A microstripline transmission line arrangement, the arrangement comprising:
a first microstripline transmission line;
a second microstripline transmission line; and
a coaxial electrically conductive conduit extending in a longitudinal direction to electrically couple the first transmission line and the second transmission line, the conduit including a signal conductor and an electrically grounded element, the conductor and the grounded element being separated by a gap defined in latitudinal directions substantially perpendicular to the longitudinal direction, the gap varying in the longitudinal direction in between the first and second transmission lines, the signal conductor including a polygon-shaped cross section, wherein the grounded element includes two ground planes parallel to each other and to the first and second transmission lines, and wherein a first of the ground planes includes a first polygon-shaped opening, and a second of the ground planes includes a second polygon-shaped opening having a larger width than the first polygon-shaped opening, the signal conductor passing through the openings.

3. A microstripline transmission line arrangement for carrying a signal having a fundamental frequency, the arrangement comprising: a first microstripline transmission line; a second microstripline transmission line; and a coaxial electrically conductive conduit interconnecting the first transmission line and the second transmission line, the conduit including a signal conductor and an electrically grounded shield, the conductor and the shield being positioned relative to each other to thereby comprise a means for lowpass filtering the signal, a cutoff frequency of the lowpass filtering being less than a tenth harmonic of the fundamental frequency.

4. The arrangement of claim 3, further comprising dielectric material disposed between the signal conductor and the grounded shield.

5. The arrangement of claim 3 wherein the electrically grounded shield substantially surrounds the signal conductor.

6. The arrangement of claim 3 wherein the cutoff frequency of the lowpass filtering is less than a third harmonic of the fundamental frequency.

7. The arrangement of claim 3, wherein the arrangement further comprises: a first ground trace adjacent an end of the first transmission line; a second ground trace adjacent an end of the second transmission line; a first ground plane oriented substantially parallel to the first transmission line and having a first void, the conductor extending through the first void; a second ground plane oriented substantially parallel to and disposed between the second transmission line and the first ground plane, the second ground plane having a second void, the conductor extending through the second void; and a plurality of electrically conductive vias interconnecting the first ground trace, the second ground trace, the first ground plane, and the second ground plane.

8. The arrangement of claim 7, wherein the first ground trace is substantially co-planar with the first transmission line, the second ground trace being substantially co-planar with the second transmission line.

9. The arrangement of claim 7, wherein the signal conductor has a first outer diameter and a pad disposed in one of the first void and the second void, the pad having a second outer diameter greater than the first outer diameter.

10. The arrangement of claim 9, wherein the second outer diameter of the pad is at least twice as great as the first outer diameter.

11. The arrangement of claim 9, wherein the second outer diameter of the pad is greater than a diameter of an other of the first void and the second void.

12. A microstripline transmission line arrangement, the arrangement comprising: a first microstripline transmission line; a second microstripline transmission line; and a coaxial electrically conductive conduit extending in a longitudinal direction to electrically couple the first transmission line and the second transmission line, the conduit including a signal conductor and an electrically grounded element, wherein the arrangement is for carrying a signal having a fundamental frequency, the conductor and the grounded element comprising a means for lowpass filtering the signal, a cutoff frequency of the lowpass filtering being less than a tenth harmonic of the fundamental frequency.

13. The arrangement of claim 12, wherein the conductor and the grounded element define a gap therebetween, the gap being defined in latitudinal directions substantially perpendicular to the longitudinal direction, the gap varying in the longitudinal direction.

14. The arrangement of claim 12, wherein the arrangement further comprises: a first ground trace adjacent an end of the first transmission line; a second ground trace adjacent an end of the second transmission line; a first ground plane oriented substantially parallel to the first transmission line and having a first void, the conductor extending through the first void; a second ground plane oriented substantially parallel to and disposed between the second transmission line and the first ground plane, the second ground plane having a second void, the conductor extending through the second void; and a plurality of electrically conductive vias interconnecting the first ground trace, the second ground trace, the first ground plane, and the second ground plane.

15. The arrangement of claim 14, wherein the first ground trace is substantially co-planar with the first transmission line, the second ground trace being substantially co-planar with the second transmission line.

16. The arrangement of claim 14, wherein the signal conductor has a first outer diameter and a pad disposed in one of the first void and the second void, the pad having a second outer diameter greater than the first outer diameter.

* * * * *